(12) United States Patent
Solowan

(10) Patent No.: US 10,733,337 B2
(45) Date of Patent: Aug. 4, 2020

(54) METHOD AND DEVICE FOR THE SIMULATION OF A PHOTOLITHOGRAPHIC PROCESS FOR GENERATING A WAFER STRUCTURE

(71) Applicant: Carl Zeiss SMT GmbH, Oberkochen (DE)

(72) Inventor: Hans Michael Solowan, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 767 days.

(21) Appl. No.: 15/423,810

(22) Filed: Feb. 3, 2017

(65) Prior Publication Data
US 2017/0228477 A1    Aug. 10, 2017

(30) Foreign Application Priority Data
Feb. 8, 2016   (DE) .................. 10 2016 201 831

(51) Int. Cl.
*G06F 30/20*    (2020.01)
*G03F 7/20*    (2006.01)
(Continued)

(52) U.S. Cl.
CPC ............ *G06F 30/20* (2020.01); *G03F 1/0092* (2013.01); *G03F 1/72* (2013.01); *G03F 1/84* (2013.01);
(Continued)

(58) Field of Classification Search
CPC ........ G06F 17/5009; G06F 30/20; G03F 1/72; G03F 1/20; G03F 1/26; G03F 1/0092; G03F 1/84; G03F 1/705; G03F 7/26
(Continued)

(56) References Cited

U.S. PATENT DOCUMENTS 6,049,660 A    4/2000 Ahn et al.
7,043,071 B2 *  5/2006 Qian ................... G06T 7/0002
                                            382/144
(Continued)

FOREIGN PATENT DOCUMENTS

CN         1087099      5/1994    ............... C08K 5/17
CN       101727520      6/2010    ............. G06F 17/50
(Continued)

OTHER PUBLICATIONS

German Office Action for German Application No. 10 2016 201 831.0 dated Oct. 7, 2016.
(Continued)

*Primary Examiner* — Eunhee Kim
(74) *Attorney, Agent, or Firm* — Fish & Richardson P.C.

(57) ABSTRACT

A method for the simulation of a photolithographic process for generating a wafer structure includes providing an aerial image of a region of a mask that includes the mask structure, prescribing a range of intensities, determining auxiliary or potential wafer structures for different threshold values within the range of intensities, determining the number of structure elements for each of the auxiliary or potential wafer structures, determining a stability range consisting of successive threshold values from the threshold values that were used for the determination of auxiliary or potential wafer structures, within the stability range the number of structure elements of the auxiliary or potential wafer structures remaining constant or lying within a prescribed range, and determining the wafer structure on the basis of the aerial image and a threshold value within the stability range. A microscope for carrying out the method is also provided.

26 Claims, 5 Drawing Sheets

(51) Int. Cl.
  *G03F 1/00* (2012.01)
  *G03F 1/84* (2012.01)
  *G03F 1/72* (2012.01)
  *G03F 7/26* (2006.01)

(52) U.S. Cl.
  CPC .................. *G03F 7/20* (2013.01); *G03F 7/26* (2013.01); *G03F 7/705* (2013.01)

(58) Field of Classification Search
  USPC .......................................................... 703/13
  See application file for complete search history.

(56) References Cited

U.S. PATENT DOCUMENTS

| | | | | |
|---|---|---|---|---|
| 8,539,392 | B2* | 9/2013 | Tsai | H01J 37/3026 716/53 |
| 9,005,852 | B2* | 4/2015 | Satake | G06F 17/5068 430/5 |
| 10,073,936 | B2 | 9/2018 | Yamazoe | |
| 2006/0190850 | A1* | 8/2006 | Kohle | G03F 1/36 716/53 |
| 2008/0247632 | A1 | 10/2008 | Boehm et al. | |
| 2010/0115489 | A1 | 5/2010 | Song et al. | |
| 2010/0191518 | A1 | 7/2010 | Chen et al. | |
| 2011/0016437 | A1 | 1/2011 | Scheruebl et al. | |
| 2011/0188732 | A1 | 8/2011 | Stroessner | |
| 2015/0198541 | A1 | 7/2015 | Trautzsch et al. | |
| 2015/0346610 | A1* | 12/2015 | Tam | G03F 7/70666 355/55 |

FOREIGN PATENT DOCUMENTS

| | | | |
|---|---|---|---|
| CN | 102007454 | 4/2011 | ............... G03F 7/20 |
| DE | 197 57 696 | 9/1998 | ............... G03F 1/00 |
| DE | 102011104357 | 12/2012 | ............... G06T 15/00 |
| DE | 102013020705 | 6/2015 | ............... G03F 1/84 |
| TW | 200641550 | 12/2006 | ............... G03F 7/20 |
| TW | 200931191 | 7/2009 | ............... G03F 7/20 |
| TW | 201102850 | 1/2011 | ............... G03F 17/50 |

OTHER PUBLICATIONS

The Third Office Action issued by the Chinese Patent Office for Chinese Application No. 201710070668.7 dated Jul. 2, 2019.
The German Office Action by the German Patent Office for German Application No. 10 2017 101 340.7 dated Jun. 17, 2019.
The First Office Action issued by the Chinese Patent Office for Chinese Application No. 20170070668.7 dated Feb. 2, 2018.
The Second Office Action issued by the Chinese Patent Office for Chinese Application No. 20170070668.7 dated Nov. 2, 2018.
The Taiwan Office Action and Search Report issued by the Taiwan Patent Office for Taiwanese Patent Application No. 106104088 dated Feb. 13, 2018.

* cited by examiner

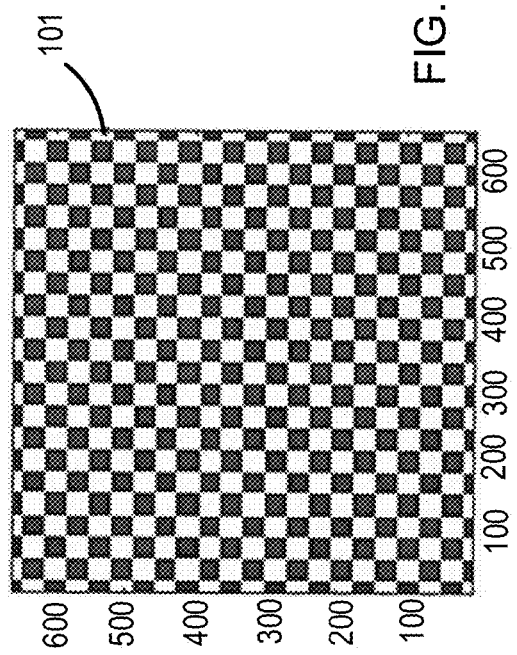
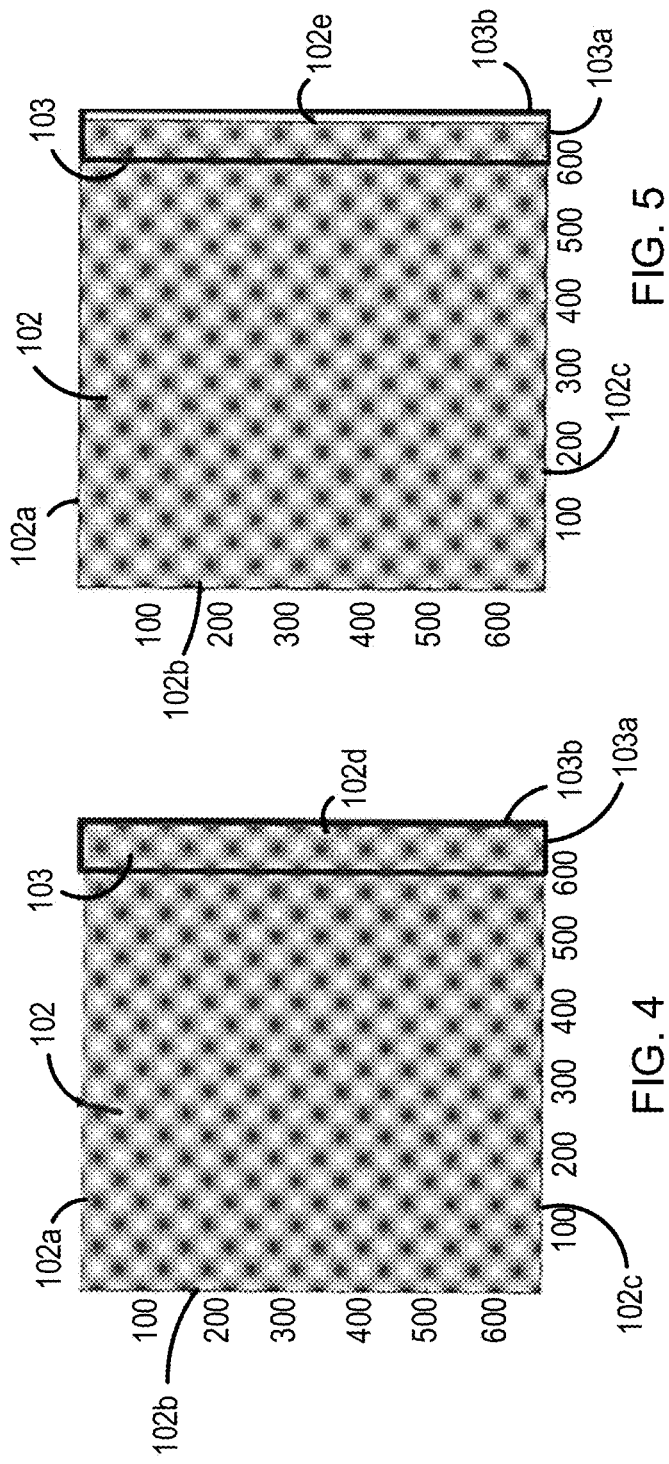

METHOD AND DEVICE FOR THE SIMULATION OF A PHOTOLITHOGRAPHIC PROCESS FOR GENERATING A WAFER STRUCTURE

CROSS-REFERENCE TO RELATED APPLICATION

Under 35 U.S.C. §119, this application claims priority to German Patent Application No. 10 2016 201 831.0, filed on Feb. 8, 2016, whose disclosure content is hereby incorporated by reference in its entirety.

TECHNICAL FIELD

The invention relates to a method and a device for the simulation of a photolithographic process for generating a wafer structure on the basis of an aerial image of a mask that has a prescribed structure.

BACKGROUND

For producing semiconductors, silicon wafers are coated with a light-sensitive lacquer, which is referred to as a resist. The structure to be provided on the wafer is created on a mask (photomask or reticle) and projected as an image into the light-sensitive layer of resist by exposure by use of a lithographic scanner. Microscopes are used to check masks for defects. These microscopes are designed in such a way that the aerial image recorded corresponds with great accuracy to the image that is generated on the wafer by the scanner. These microscopes are also referred to as mask inspection microscopes. The use of mask inspection microscopes allows masks to be checked (mask review) without it being necessary to carry out exposure of a wafer for checking a mask.

A mask inspection microscope is used to record the aerial image of a region of a mask. To investigate the behavior of mask structures, the aerial images of a mask may be simulated on the basis of the prescribed structure. Corresponding computer programs for the simulation of aerial images are known.

In order to obtain from the aerial image of a mask the expected structure that is obtained on the wafer, the contrast-enhancing effect of the resist, the light-sensitive layer, must be simulated. This is achieved in an easy way by the fixing of an intensity threshold value (also referred to hereinafter simply as the threshold value) and application of this threshold value to the aerial image. The threshold value may be specified as a proportion of the maximum intensity value of an aerial image. This method is referred to hereinafter as the threshold value method.

The threshold value discussed here is, to a good approximation, a measure of the dose. If the mask is used in a scanner for exposing a wafer, the illumination intensity in the exposure, the dose, is adapted in such a way that the structure depicted as an image in the resist corresponds to the prescribed dimensions within the tolerance limits.

The operation that is performed when exposing the resist and its subsequent development can be simulated with great accuracy. In addition to the threshold value or the dose, a number of parameters that describe the resist used are prescribed for this purpose. These parameters are then taken into consideration in the determination of the wafer structure from the aerial image. Such computer programs are known and are referred to as resist simulators, the method as resist simulation. Such a method is disclosed for example in the German laid-open specification DE19757696.

For the determination of a wafer structure from an aerial image, a threshold value or a dose must be prescribed. Until now, for this a threshold value has been chosen arbitrarily. When choosing this threshold value, it is not known whether it will lead to the desired structure.

SUMMARY

When checking a mask, the stability of the structure to be depicted as an image with respect to fluctuations of parameters during the exposure of a wafer, such as for example the defocusing, the illumination intensity in the exposure and the dose, should also be determined. The ranges of tolerances within which all of the parameters that are relevant during wafer exposure may vary while the wafer structure is still within the prescribed specifications is also referred to as the process window. A quick and easy method for determining the process window with respect to the dose and the defocusing is advantageous.

In a general aspect, the invention provides a method which makes it possible to determine a wafer structure while avoiding the disadvantages mentioned. This is achieved according to the invention by a method for the simulation of a photolithographic process for generating a wafer structure on the basis of a prescribed mask structure, comprising the steps of: providing an aerial image of a region of a mask that includes the mask structure, prescribing a range of intensities, determining auxiliary wafer structures or potential wafer structures for different threshold values within the range of intensities, determining the number of structure elements for each of the auxiliary wafer structures or potential wafer structures, determining a stability range consisting of successive threshold values from the various threshold values that were used for the determination of auxiliary wafer structures or of potential wafer structures, the number of structure elements of the auxiliary wafer structures or of potential wafer structures remaining constant or lying within a prescribed range, and determining the wafer structure on the basis of the aerial image and a threshold value within the stability range.

A wafer structure is the term used here for any structures that are depicted as an image in the resist of the wafer, or structures that are created there, or structures that have been created after developing the resist and after etching the surface of the wafer.

Auxiliary wafer structures or potential wafer structures are the terms used here for wafer structures which in this specification are calculated or otherwise simulated and in each case produce a threshold value as the result of a simulation method. The more the threshold value chosen for a simulation differs from the behavior of the actual photoresist, the more the deviation of the auxiliary wafer structures or potential wafer structures from an actual exposure will also be. The actual wafer structure may occur as one of the auxiliary wafer structures or potential wafer structures at a most suitable threshold value or target threshold value. This is not necessarily the case however.

The region of the mask may correspond to the image field of a microscope for recording the aerial image.

Aerial images may be described as two-dimensional intensity distributions. The prescribed range of intensities may comprise all intensities that occur in an aerial image. If the intensity values of an aerial image are specified as proportions of the maximum intensity value of an aerial image, the prescribed range of intensities may be prescribed from 0 to 100%. A restricted range, for example 10% to 90%, may also be prescribed. Within a range of intensities from 0 to 100%, a number of threshold values, for example 50, 40 or 30, may be prescribed.

The aerial image may be the aerial image of the best focal plane of an imaging. An aerial image that is at a distance from the best focal plane may also be determined. A wafer structure may be determined for each image of a focus stack (also referred to as a Z-stack or an image stack). This makes it possible in an easy way to determine the process window of the region of the mask with respect to a deviation of the focusing from the best focus.

The prescribed threshold values within a range may have identical intervals in each case. The intervals of the intensity values may also be varied as dependent on the variation in the number of structure elements. In the case of a stronger variation of the number of structure elements in dependence on the respective intensity value, smaller intervals of the intensity values are then chosen.

Structure elements of a mask are contiguous regions of a wafer structure or of an auxiliary wafer structure or potential wafer structures. The regions may be referred to as transparent or reflective or non-transmissive or absorbent with respect to the respective regions of the mask. Often, masks with reflective regions are used for microlithographic apparatuses that are operated at wavelengths in the extreme ultraviolet range (EUV). Transparent masks on the other hand are often used at wavelengths greater than 150 nm, in particular at 193 nm. There is generally no direct relationship between transparent or reflective or non-transmissive or absorbent regions of a mask and the intensity of the corresponding region on the wafer. This is the case in particular when using methods for increasing the resolution, such as for example when using OPC methods (OPC stands for Optical Proximity Correction) or SMO methods (SMO stands for Source Mask Optimization). For describing a wafer structure, however, the term "transparent" (clear) has been adopted for regions of high intensity, i.e. for "exposed regions", and the term "non-transmissive" (opaque) has been adopted for regions of low intensity, i.e. "unexposed regions". These terms are used in this specification.

A structure element is considered to be a contiguous transparent or reflective or non-transmissive or absorbent region. The number of structure elements may be determined as the sum of transparent or reflective and non-transmissive or absorbent structure elements. The number of structure elements may also be determined as the number of transparent or reflective structure elements or as the number of non-transmissive or absorbent structure features.

The properties of a structure element are referred to as structure features. Examples of structure features are tone, contour, width, critical dimension and aspect ratio. A person skilled in the art knows that many other structure features exist and can be used for describing the structure elements.

A structure type is a classification of structure elements and can be defined by structure features. If a structure element or a group of structure elements has prescribed structure features, this structure element or this group of structure elements is assigned to a structure type. Examples of structure types that may be prescribed are end-to-end, contact hole and lines and spaces. Other structure types are known to a person skilled in the art.

This measure has the advantage that the wafer structure of a mask can be determined without prescribing a threshold value. In this case, a range of threshold values which, to a good approximation, represents the dependence of the variation of the wafer structure on the variation of the intensity of the exposure by the scanner, the dose, is determined. This makes it possible in an easy way to determine the process window of the region of the mask with respect to the dose.

In a further configuration of the invention, the method comprises the step of: determining as a threshold value a target threshold value that lies in the middle of the stability range.

The aim is often to determine a target threshold value for which the wafer structure determined has the greatest possible invariance with respect to fluctuations in intensity or dose. The determination of the middle of the intensity range is possible in an easy way from the maximum and minimum threshold values of a stability range.

In further measures, the target threshold value may be determined by further criteria. If, for example, a stability range comprises auxiliary wafer structures or potential wafer structures with a different number of structure elements, the threshold value at which the variation of the number of structure elements is the smallest may be chosen as the target threshold value.

This measure has the advantage that a threshold value which leads to a wafer structure that has great invariance with respect to fluctuations in dose is determined in an easy way.

In a further configuration of the invention, the aerial image is determined by being recorded by a microscope.

A mask inspection microscope, which largely reproduces the imaging behavior of a scanner, may be used for this measure. Thus, a light source that emits the same illumination radiation as a scanner is used. This may be light of the wavelength 193 nm or 13.5 nm.

In a further configuration of the invention, the aerial image is simulated from the prescriptions for the structure of the region of the mask.

This measure has the advantage that first an aerial image of a mask can be determined in a quick and easy way without the use of a microscope. Methods for the simulation of aerial images are known.

In particular, in the case of SMO masks or in the case of masks that may have OPC structures, the structure to be expected on the wafer can thus be determined in a quick way.

In a further configuration of the invention, the determination of the wafer structure or of the auxiliary wafer structure or potential wafer structures from the aerial image comprises subdividing the aerial image into first regions and second regions on the basis of the threshold value or the target threshold value.

In a further configuration of the invention, locations of the aerial image are assigned to the first regions if intensity values of the aerial image are greater than the threshold value or the target threshold value, while locations of the aerial image are assigned to the second regions if the intensity values are less than the threshold value.

The two aforementioned measures have the advantage that a quick and easy determination and visualization of the wafer structure can be performed. The wafer structure may for example be represented as a two-color image. In this case, first regions may be represented in a first color and second regions in a second color.

In a further configuration of the invention, transparent or reflective structure elements of the first regions are formed as contiguous regions with a threshold value above a prescribed threshold value or a target threshold value and non-transmissive or absorbent structure elements are formed as contiguous regions with a threshold value below a prescribed threshold value or a target threshold value.

The assignment of the structure elements to the first and second regions may also be performed the opposite way.

In a further configuration of the invention, the method comprises the step of: determining the wafer structure from a simulation of the exposure and development of the light-sensitive layer of a wafer on the basis of the aerial image and the target threshold value.

This measure has the advantage that the wafer structure is determined with increased accuracy. First and second regions can be determined from the wafer structure obtained by simulation. In a variant, this measure may comprise as a further step the simulation of the operation of etching the surface of the exposed wafer. As explained above, this measure is also referred to as resist simulation.

In a further configuration of the invention, the method comprises the step of: trimming the peripheral region of the aerial image, cutting edges at which the fluctuation of the intensity along the cutting edges lies within a prescribed range being chosen, this step being performed before determining the number of structure elements.

The periphery of the region of the mask to be investigated may have been chosen arbitrarily. It is then possible that structure elements in the peripheral region have been cut off or broken up. These incomplete structure elements could falsify the result when determining the number of structure elements. The aforementioned measure makes it possible that these incomplete structure elements are not taken into consideration when determining the number of structure elements.

The aerial image can be cut to size around the periphery, and individual edges or parts of individual edges can be trimmed.

The intensity profile is determined along an edge of the aerial image. This determination is performed for a peripheral region of a prescribed width. A variable that is characteristic of the fluctuation of the intensity and is a criterion for the number of incomplete structure elements is determined for each of the intensity profiles within the peripheral region.

The standard deviation of the intensity or the summated intensity or the histogram of the intensity or the entropy of the intensity profile may be determined as a characteristic variable.

In a variant of the method, the aerial image may be trimmed for the determination of the auxiliary wafer structures or potential wafer structures, the untrimmed aerial image being used as the aerial image for the representation of the wafer structure. The trimmed aerial image may then be referred to as the auxiliary aerial image.

In a further configuration of the invention, auxiliary wafer structures or potential wafer structures are determined for at least 50 or 40 or 30 different threshold values.

In a further configuration of the invention, a number of stability ranges are determined for a mask structure.

It may happen that a structure has a number of stability ranges. This may be caused by the nature of the prescribed structure of the mask, or be caused by a defect on the structure of the mask. A wafer structure and a target threshold value may be determined for each of the stability ranges.

Which of the stability ranges or target threshold values is the preferred one may be determined by further investigations.

In a further configuration of the invention, a preferred stability range is determined from a number of stability ranges, the stability range within which the wafer structure has the greatest number or a prescribed number of structure elements or comprises the greatest range of intensities being chosen as the preferred stability range.

This measure makes it possible to determine a wafer structure when there are a number of stability ranges.

In a further configuration of the invention, the method comprises the steps of: determining a preferred stability range from a number of stability ranges, the stability range which comes closest to a prescribed ratio of the number of transparent structure regions and the number of non-transmissive structure regions or is greater than the ratio or less than the ratio being chosen as the preferred stability range.

This measure has the advantage that the desired stability range can be determined in an easy way.

In further variants, the prescribed ratio of the number of transparent structure elements and the number of the sum of transparent structure elements and non-transmissive structure elements is formed as a criterion.

In further variants, the prescribed ratio of the number of non-transmissive structure elements and the number of the sum of transparent structure elements and non-transmissive structure elements is formed as a criterion.

In a further configuration of the invention, the structure type of at least one of the structure elements is determined for at least two stability ranges, the stability range for which the determined structure type corresponds to a prescribed structure type being chosen as the preferred stability range.

The structure type may be defined by structure features. If a structure element or a group of structure elements has prescribed structure features, this structure element or this group of structure elements is assigned to a structure type. Examples of structure features are tone, contour, width, critical dimension and aspect ratio. Examples of structure types are "end-to-end", "contact hole" and "lines and spaces".

Examples of structure types that may be prescribed are end-to-end, contact hole or lines and spaces. The structure types may be prescribed by values or value ranges of parameters such as tone, contour, width, critical dimension or aspect ratio. Examples are given in Table 1. Other structure types are known to a person skilled in the art.

This measure has the advantage that the preferred stability range can be determined with great certainty. It is also possible for a number of structure types to be determined and verified for conformity. The preferred stability range is then the stability range in which all of the determined structure types are as prescribed or the stability range in which the greatest number of structure types are as prescribed.

In a variant of this measure, only one prescribed structure type or a selection of structure types may be taken into consideration when determining the number of structure elements for the auxiliary wafer structures or potential wafer structures.

The invention also comprises a method for determining a threshold value for a mask structure, comprising the steps of: providing an aerial image of the mask structure, prescribing a range of intensities, prescribing different threshold values within the range of intensities, determining an auxiliary wafer structure or potential wafer structure for each of the threshold values, determining the number of structure features for each of the auxiliary wafer structures or potential wafer structures, determining a stability range of successive threshold values from threshold values of the range of intensities for which the number of structure elements of the auxiliary wafer structures or potential wafer structures lies within a prescribed range or remains constant, and determining the threshold value as a threshold value within the stability range.

The advantages and further configurations of this method follow from the statements made above.

The invention also comprises a microscope for determining a wafer structure of a mask, having:
- a light source and an illumination optical unit for illuminating the mask,
- an imaging optical unit for projecting an image of the mask onto a detector,
- a computing unit for reading out the aerial image from the detector, the computing unit being programmed for carrying out the aforementioned methods.

The features of the invention mentioned above and those yet to be explained below can be used not only in the combinations described, but also in other combinations or individually, without departing from the scope of the present invention.

BRIEF DESCRIPTION OF DRAWINGS

The invention is described and explained in greater detail below on the basis of some selected exemplary embodiments and with reference to the drawings.

In the figures:

FIG. 3: shows an example of a region of a mask to be investigated;

FIG. 4: shows an example of an aerial image of the region of the mask from FIG. 3 with a marked peripheral region;

FIG. 5: shows a representation of an aerial image of the region of the mask from FIG. 3 trimmed at one edge;

DETAILED DESCRIPTION

Figure 1:
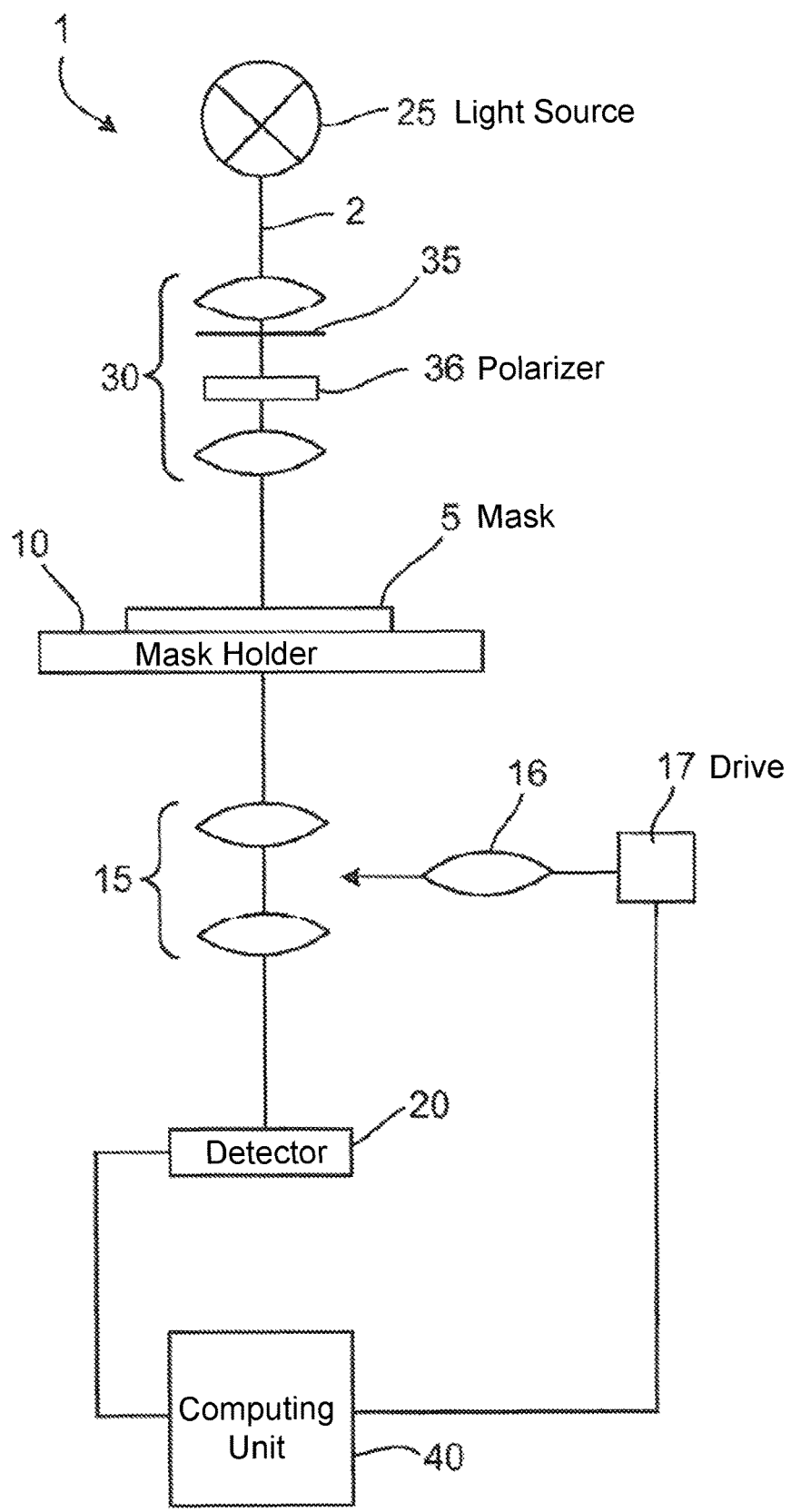
FIG. 1: shows a schematic representation of the construction of a microscope.

The construction of a microscope 1, which is suitable for the investigation of masks, is explained on the basis of FIG. 1. The microscope 1 has a mask holder 10 (also referred to as a stage), on which the mask 5 to be imaged rests. The mask 10 is movable in the mask plane, also referred to as the X-Y plane. The microscope 1 also has a detector 20, formed as a CCD chip (Charged Coupled Device). A light source 25 illuminates the mask 5 by way of an illuminating optical unit 30, which has a pupil plane 35. Illumination settings can be set by way of a pupil filter, which is arranged in the pupil plane 35, and a polarizer 36. The illumination radiation has a wavelength of 193 nm. When recording the aerial images of the mask 5 with the detector 20, illumination settings and polarization settings that are adapted to the structure are used.

Figure 2:
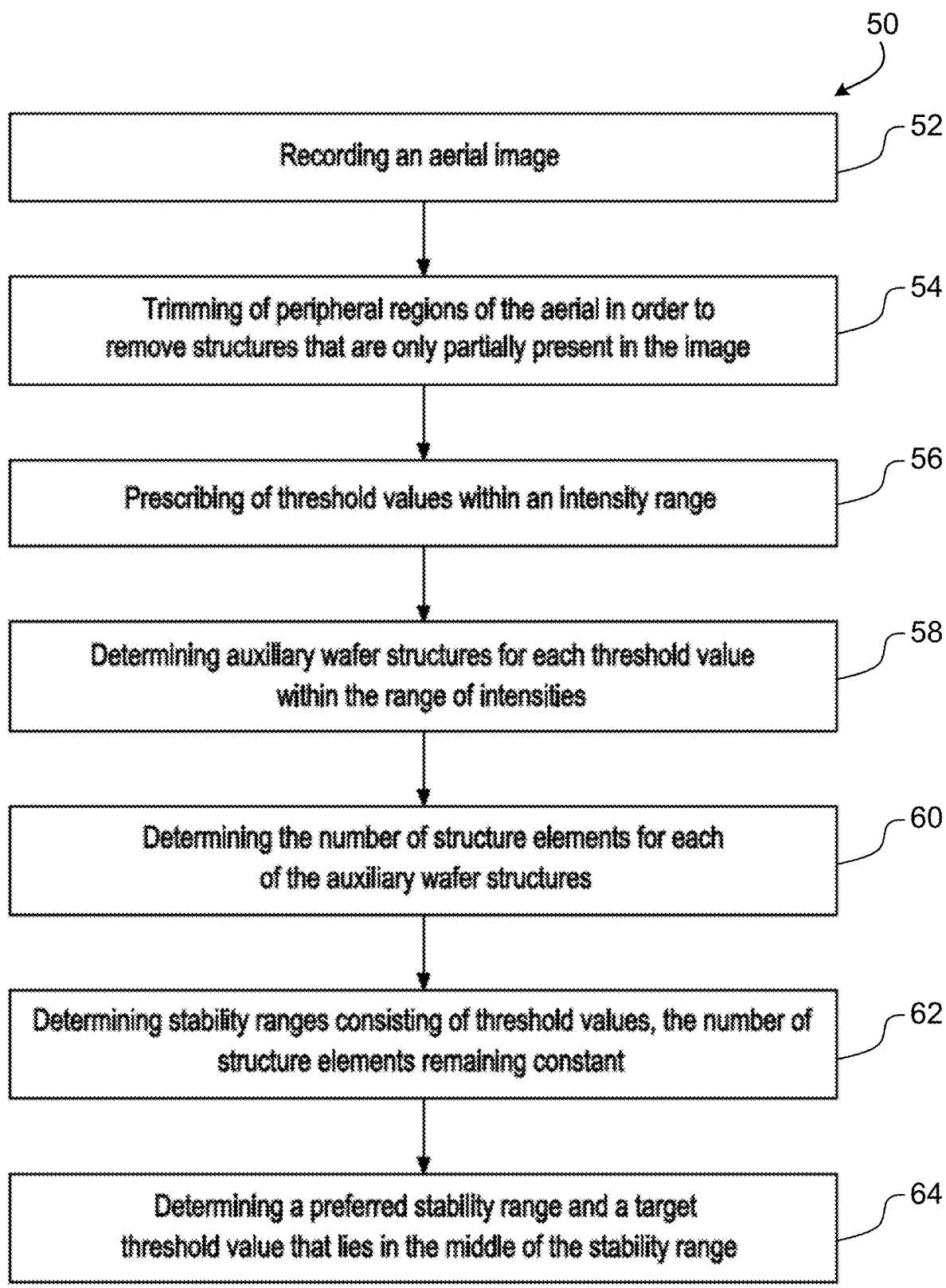
FIG. 2: shows a flow diagram of the method for determining a wafer structure.

Referring to FIG. 2, an exemplary process 50 is provided for the simulation of a photolithographic process for generating a wafer structure on the basis of a prescribed mask structure. For example, the process 50 can be implemented using the microscope 1 of FIG. 1. The process 50 includes generating (52) an aerial image of the mask 5. For example, the aerial image of the mask 5 can be generated by the imaging optical unit 15, with the optical axis 2, in the plane of the detector 20. By moving the mask holder 10, the region of the mask 5 that is to be imaged is brought into the path of rays of the microscope 1. For focusing, the imaging optical unit 15 is moved in the direction perpendicular to the X-Y plane, referred to as the Z direction, along the optical axis 2. The aerial image is read out by the computing unit 40, which is formed as a computer. The aerial image first takes the form of a data record or data structure in the main memory of the computer. This can be stored as a graphics file on the hard disk of the computer. The data structure or the graphics file is a two-dimensional matrix (also referred to as an array), which is made up of pixels. The intensities of the pixels are represented by numerical values from 0 to 255. The image field on the mask 5 is square, with an edge length of 10 μm. The cutout of the recorded partial structure of the mask 5 is determined by the image field.

For recording an aerial image of the intensity distribution in the pupil plane 35 of the illumination optical unit 30, a Bertrand lens 16 is introduced into the path of rays of the microscope 1 by a drive 17, controlled by the computing unit 40. The aerial image is stored in the memory of the computing unit 40 as a first matrix with constant resolution.

For recording focus stacks or Z-stacks, an image is recorded in the best focal plane and further images are recorded in parallel planes that are at a distance from the best focal plane in the Z direction. Images are recorded above and below the best focal plane.

Microscopes such as the microscope 1 described are used for the investigation of masks in lithography as a mask inspection microscope or as position measuring devices.

A further microscope that is not represented operates at the wavelength of 13.5 nm. It serves for the investigation of so-called EUV masks.

For the evaluation of the aerial images, the program MatLab, sold by the company MathWorks, Natick, Mass., is used.

The determination of the aerial image is performed by recording an aerial image by the microscope 1 or by simulation of an aerial image taken from a prescribed mask structure by the computing unit 40.

The intensities of an aerial image are normalized and, after the normalization, specified as a percentage or as values in the range between 0 and 1. The measured values $I_m$ of the intensities are determined in relation to the intensity $I_{clear}$ of the aerial image of a mask without a structure, i.e. with maximum transmissivity for illumination radiation, i.e. $I=I_m/I_{clear}$.

In a first optional step of the method, the peripheral regions of the aerial image are trimmed in order to remove structures that are only partially present in the image (54). The trimming is performed in such a way that the influence of structures that are only partially present in the image is avoided. These would falsify the number of structure elements.

Intensity profiles are determined along an edge of the aerial image. This determination is performed for a peripheral region of a prescribed width. The width of the region may be for example 10 pixels or 20 or 50 pixels. Within this range, an intensity profile is determined for each row of pixels. The intensity profile takes the form of a one-dimensional matrix or one-dimensional array. Consequently, intensity profiles that are parallel to one another are determined. In one variant, for the determination of intensity profiles a number of parallel intensity profiles are combined by forming the average of the respective values. A characteristic variable that is a criterion for the number of incomplete structure elements is determined for each of the intensity profiles.

For example, the following variables may be determined as the characteristic variable: the standard deviation of the intensities of the intensity profile, the sum of all of the intensities of the intensity profile, the histogram of the intensities of the intensity profile, the entropy of the intensity profile or the standard deviation thereof.

For the determination of a histogram, all of the intensity values of the same magnitude are counted for all possible intensity values within the intensity profile. The results are plotted as the number of intensity values occurring against the magnitude of the intensity values. The function imhist (I)=[counts, binLocations] of the Matlab program is used for the method. In this case, the number of respective intensity values in counts and the associated intensity values in binLocations are returned. I is the intensity profile.

The entropy E of an intensity profile is determined from the histogram according to the formula: E=−sum (counts*log$_2$(counts)). This corresponds to the MatLab function entropy(I).

Starting from the periphery of an aerial image, the characteristic variable, such as for example the entropy, is then determined within the region for each of the intensity profiles determined. From all of the intensity profiles, the intensity profile that has the lowest entropy value is determined. This intensity profile is established as a cutting edge. Cutting edges are determined in this way for all four peripheries of the aerial image.

Regions of the aerial image that lie outside the cutting edges are removed. In a variant of the method, first an auxiliary aerial image that is identical to the aerial image is created and this auxiliary aerial image is trimmed. The auxiliary aerial image is then used for the further evaluation, while the untrimmed aerial image is taken as a basis for the representation of the wafer structure.

In a further step of the method, an intensity range within which stability ranges of a wafer structure are to be determined is prescribed.

The intensity range may be chosen from 0 to 100% of the intensities of the aerial image. Depending on the structure type, smaller ranges may also be chosen. Ranges of intensity values may also be excluded.

The process 50 includes prescribing of threshold values within an intensity range (56). For example, the chosen intensity range is divided into intervals of the same size. For each of the threshold values thus determined, an auxiliary wafer structure or potential wafer structure is determined (58). For each auxiliary wafer structure or potential wafer structure, the number of structure elements is determined (60). In a variant of the method, the intervals of the intensity values may also be varied as dependent on the variation in the number of structure elements. When there is a stronger variation of the number of structure elements in dependence on the intensity values, smaller intervals of the intensity values are then chosen.

One of the methods mentioned for determining wafer structures, either the threshold value method or a resist simulation, is used for the determination of a wafer structure or an auxiliary wafer structure or potential wafer structure.

In the case of the threshold value method, locations of the aerial image at which intensity values of the aerial image are greater than the threshold value are assigned to the first regions, while locations of the aerial image are assigned to the second regions if the intensity values are less than the respective threshold value. Intensity values that are equal to the threshold value may be assigned either to the first regions or to the second regions.

A threshold value is applied to an aerial image in such a way that regions for which the intensity values lie below the threshold value are marked as "non-transmissive" and regions for which the intensity values lie above the threshold value are marked as "transparent". In the case of reflective masks, the regions are marked on the basis of the intensity values as "absorbent" and "reflective". There is consequently an assignment of the intensity values to first regions and to second regions. The wafer structure may then be graphically represented for example by "white" for regions of the mask marked as transparent or reflective and "black" for regions of the mask marked as non-transmissive or absorbent. The "black" and "white" markings may also be used the opposite way. This is dependent on the type of light-sensitive lacquer (resist) that is used on the wafer. A positive resist or a negative resist may be used, either the regions that were exposed to illumination radiation with an intensity above the threshold value being etched away or the regions that were exposed to illumination radiation with an intensity below the threshold value being etched away. The other regions respectively remain.

A suitable method for resist simulation is disclosed for example in the already cited German laid-open specification DE19757696. The assignment of the intensity values to first regions and to second regions is performed by this method. The graphical representation and the further evaluation are performed as above.

In a further step of the method, the number of structure elements is determined for each of the auxiliary wafer structures or potential wafer structures.

Contiguous first and second regions of transparent or non-transmissive structure elements of each auxiliary wafer structure or potential wafer structure are determined. This is performed by the functions bwlabel, bwlabeln and bwconncomp of the MatLab program mentioned.

For the assessment of the stability, the number of structure elements is determined. Different variables may be determined as the number of structure elements to be taken into consideration. The sum of all the transparent and non-transmissive structure elements may be determined. The sum of all the transparent structure elements or the sum of all the non-transmissive structure elements may be determined. Only structure elements of a prescribed size may be taken into consideration in the determination of the sum. Only structure elements below or above a prescribed size may be taken into consideration.

In a variant of the method, only structure elements that have a prescribed structure type or a number of prescribed structure types are counted.

The assignment of structure types to structure elements of wafer structures is performed by using the design software CATS from the company Synopsis Inc., Mountain View, Calif.

Structure types that are characterized by structure features are prescribed. The structure features are assigned properties such as "non-transmissive" or "transparent" or values of ranges of measured variables. These properties or ranges of values are nominal values or admissible tolerance ranges that are prescribed for a structure type. Examples of structure types, structure features and possible values and ranges of values are given in Table 1.

TABLE 1

| Structure type | End to end (End-to-End) (MM) | Contact hole (Contact Hole) (BOXROT) | Lines and spaces (Lines and Spaces) (CDR) |
|---|---|---|---|
| Tone (TONE) | Non-transmissive (OPAQUE) | transparent (CLEAR) | transparent (CLEAR) |
| Contour (CONTOUR) | open (OPEN) | closed (CLOSED) | open (OPEN) |
| Width (NM_WIDTH) | 0.09-2 µm | 0.08-0.5 µm | 0.5-2 µm |
| Critical dimension (CD) | 0.09-0.6 µm | 0.11-0.5 µm | 0.19-0.35 µm |
| Aspect ratio (ASPECT RATIO) | 1-60 | 1-3 | 2-11 |

The respective technical terms and also the terms in the CATS design environment are given in brackets. The numerical values are examples.

The structure type of a structure element is determined automatically by the CATS software. In this program, corresponding image processing and analysis algorithms are implemented.

Decision criteria that form a correlation data record are prescribed for the automatic determination of the structure types. The decision criteria may have a hierarchical structure. Decision nodes may be prescribed for structure features. At a decision node, a structure feature, such as for example the tone, is prescribed and the decision concerning at least two alternative paths is taken in dependence on the value of the structure feature. In an example, for the value "non-transmissive" of the tonality structure feature, the end-to-end structure type is directly assigned. If the tonality structure feature has the value "transparent", in the next step the structure feature "aspect ratio" is checked. A threshold value is prescribed there. If the value is below the threshold value, the lines and spaces structure type is assigned; if the value lies above the threshold value, the contact hole structure type is assigned.

In a further step of the method, stability ranges are determined (62). These are intensity ranges within which the structure does not vary, or only little. Ranges within which the number of structure elements remains constant or lies within a prescribed range or varies from the mean value within a prescribed deviation are determined from the threshold values and the respective number of structure elements.

A target threshold value may be determined from a stability range (64). This is the threshold value in the middle of the stability range. The target threshold value does not necessarily have to be a threshold value that has already been used in the determination of the stability range. Known interpolation methods may also be used for the determination.

The wafer structure to be simulated is determined from the aerial image and the target threshold value either by the threshold value method or by a resist simulation. While the auxiliary wafer structures or potential wafer structures follow from the respective individual threshold values, the wafer structure with the target threshold value is calculated and thus describes the result of the actual exposure operation as well as possible. This wafer structure may then be used in subsequent analyses, for example in examinations of the mask for defects. These are then displayed on a monitor of the computing unit and may also be sent by e-mail.

It is possible that a number of stability ranges are obtained as a result of the analysis. A preferred stability range may be determined (64) from a number of stability ranges on the basis of one or more of the following conditions:

The greatest stability range.

The stability range that has the greatest number of structure features. The number may be obtained by the ways described above.

The stability range that comprises a prescribed structure type or comprises or does not comprise a number of prescribed structure types. The determination of the structure types of the structure elements is performed as described above.

The stability range that comes closest to a prescribed ratio of the number of transparent structure regions and the number of non-transmissive structure regions or is greater than the ratio or less than the ratio.

A wafer structure may be determined and displayed for the preferred stability range and the associated target threshold value.

The method is explained below on the basis of an example. The region of a mask that is to be investigated is a checkerboard pattern 101, as outlined in plan view in FIG. 3. An aerial image 102 of this mask is created in the best focal plane by being recorded by a microscope 1. The aerial image 102 may also be simulated by the computing unit. The aerial image 102 is represented in FIG. 4, various intensity values been shown as grey-scale values. The aerial image is delimited by four edges 102a, 102b, 102c and 102d. The trimming of the edges is explained by the example of one edge 102d of the mask. A region 103 with the length 103b of the edge 102d of the aerial image 102 is prescribed. This extends over the aerial image 102 with a prescribed width 103a. The edge 102d of the aerial image that is to be trimmed and the longer edge 103b of the region 103 coincide here.

Figure 6:
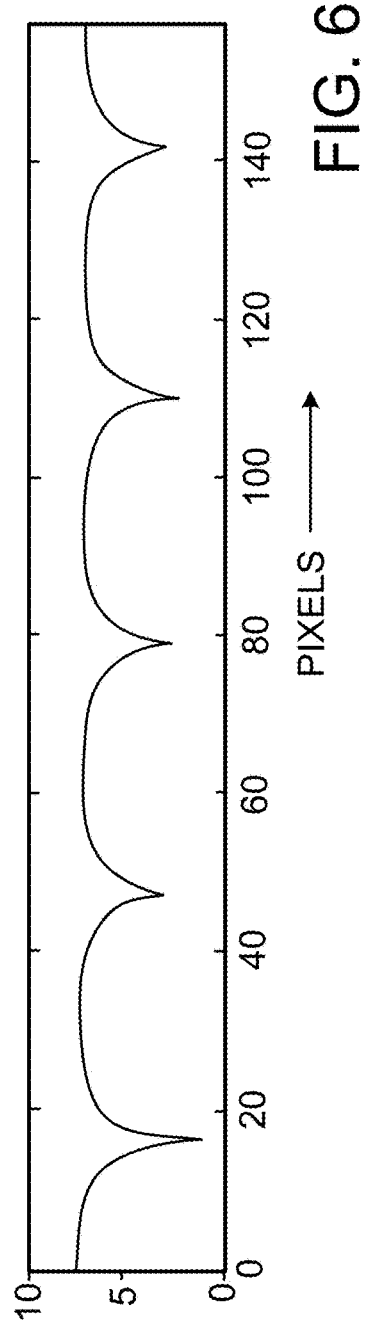
FIG. 6: shows a representation of an intensity profile of the trimmed edge from FIG. 5.

Within the region 103, intensity profiles are determined in the direction of the mask edge 102d. An intensity profile consists here of a row of pixels along the mask edge. The entropy is calculated for each intensity profile. The dependence thus determined of the entropy on the distance of the intensity profile from the mask edge is shown in FIG. 6. In this example, clear minima of the entropy can be seen. The aerial image is trimmed at the edge along the first minimum of the entropy. The cutting edge lies parallel to the edge 102d of the aerial image. The aerial image trimmed at an edge 102d with the cutting edge 102e is represented in FIG. 5.

The other three edges of the aerial image are trimmed in the same way.

Auxiliary wafer structures or potential wafer structures are determined for 50 intensity values that lie at equal intervals between 0 and 100%.

For each of the auxiliary wafer structures or potential wafer structures, the number of structure elements is determined. In this example, all of the structure elements are counted, irrespective of their properties. Particularly critical here is a threshold value of 50%. In this case, a checkerboard pattern is obtained. Regions with intensities above the threshold value, that is to say transparent regions, are in contact with the four closest transparent regions at precisely four points. Since a structure element is a contiguous transparent region, precisely one structure element would be obtained as the number. When there is a slight variation in the threshold value, some transparent regions could no longer be connected by the corners to the neighboring regions. Therefore, the number of structure elements would change greatly. In this example, therefore, especially the choice of a threshold value of 50% is very unstable.

Figure 7:
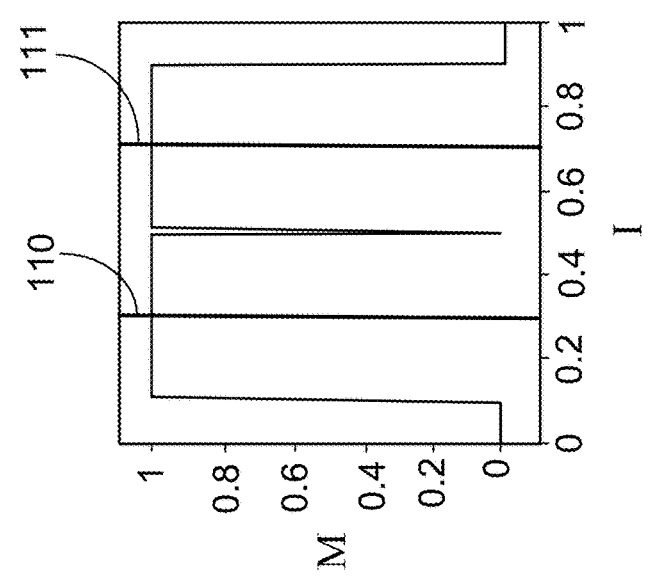
FIG. 7: shows a representation of the variation in the number of structure elements over the intensity of the threshold value used.

With threshold values that deviate enough from 0%, 50% and 100%, the number of contiguous regions no longer changes. Successive regions of structure elements within which the number of structure elements remains constant are determined. The result shows two stability ranges of the same size. In FIG. 7, the number of structure features is plotted against the intensity of the threshold values. This diagram shows two stability ranges of the same size. The target threshold values are depicted as vertical lines 110, 111. In one case the number of transparent structure elements that are delimited to a greater or lesser extent by a non-transparent region when there are different threshold values is constant, in the other case the number of non-transparent structure elements that are delimited to a greater or lesser extent by transparent regions when there are different threshold values is constant.

Figure 8:
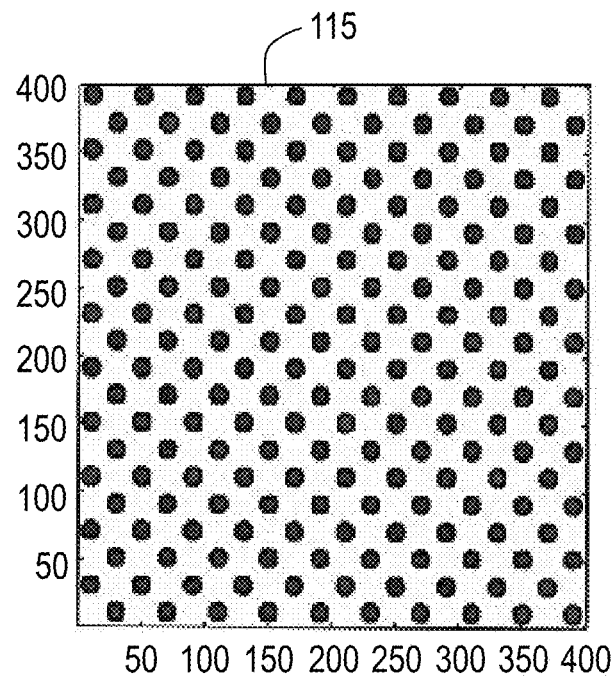
FIG. 8: shows a representation of the first potential wafer structure of the aerial image from FIG. 4.

The potential wafer structure 115 for the first target threshold value within the first stability range is shown in FIG. 8.

Figure 9:
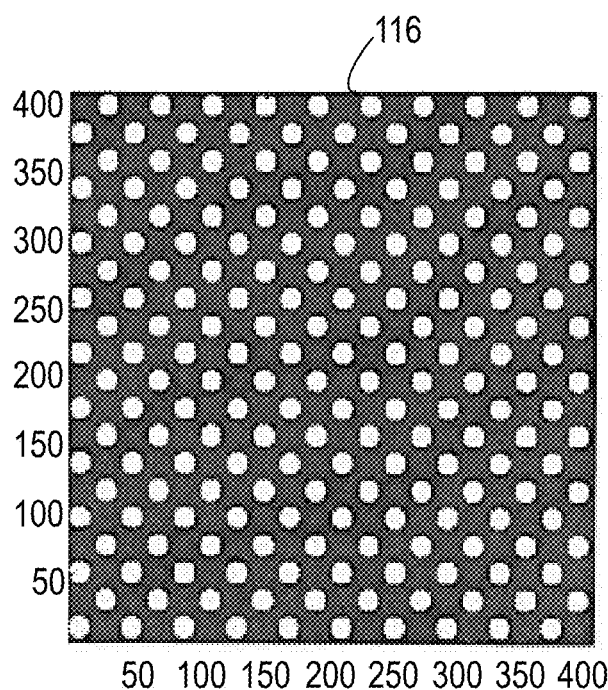
FIG. 9: shows a representation of the second potential wafer structure of the aerial image from FIG. 4.

The potential wafer structure 116 for the second target threshold value within the second stability range is shown in FIG. 9.

In the next step, the wafer structure can be selected on the basis of the prescribed structure type. "Contact hole" is prescribed as the structure type. This allows the suitable threshold value to be selected from the first and second target threshold values.

The features described above related to processing of data (for example, trimming peripheral regions of the aerial image and determining the threshold value within the stability range) can be performed by the computing unit 40. For example, the computing unit 40 can be implemented in digital electronic circuitry, or in computer hardware, firmware, software, or in combinations of them. The features related to the processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. The computer can be a cloud server. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a LCD (liquid crystal display), OLED (organic light emitting diode), or electronic ink monitor for displaying information to the user and a keyboard and a pointing device such as a mouse or a trackball by which the user can provide input to the computer. A touch screen can be provided for the user to interact with the computer. The computer may also have voice recognition functions to enable the user to interact with the computer by voice.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for the simulation of a photolithographic process for generating a wafer structure on the basis of a prescribed mask structure, comprising the steps of:
   providing an aerial image of a region of a mask that includes the mask structure,
   prescribing a range of intensities,
   determining auxiliary wafer structures or potential wafer structures for different threshold values within the range of intensities,
   determining a numerical value representing a number of structure elements for each of the auxiliary wafer structures or potential wafer structures,
   determining a stability range consisting of successive threshold values from various threshold values that were used for the determination of auxiliary wafer structures or of potential wafer structures, within the stability range the numerical value representing the number of structure elements of the auxiliary wafer structures or of the potential wafer structures remaining constant or lying within a prescribed range, and
   determining the wafer structure on the basis of the aerial image and a threshold value within the stability range.

2. The method according to claim 1, comprising the step of:
determining a target threshold value that lies within or in the middle between an upper limit and a lower limit of the stability range.

3. The method according to claim 2, wherein the determination of the wafer structure or of the auxiliary wafer structure or the potential wafer structures from the aerial image comprises subdividing the aerial image into first regions and second regions on the basis of the threshold value within the stability range or the target threshold value.

4. The method according to claim 3, wherein locations of the aerial image are assigned to the first regions if intensity values of the aerial image are greater than the threshold value within the stability range or the target threshold value, while locations of the aerial image are assigned to the second regions if the intensity values are less than the threshold value within the stability range or the target threshold value.

5. The method according to claim 4, wherein transparent or reflective structure elements are formed as contiguous regions of the first regions and non-transmissive or absorbent structure elements are formed as contiguous regions of the second regions.

6. The method according to claim 2, comprising the step of:
determining the wafer structure from a simulation of the exposure and development of a light-sensitive layer of a wafer on the basis of the aerial image and the target threshold value.

7. The method according to claim 1, wherein the aerial image is determined by being recorded by a microscope or is simulated from the prescriptions for the structure of the region of the mask.

8. The method according to claim 1, comprising the step of:
trimming a peripheral region of the aerial image, cutting edges at which the fluctuation of the intensity along the cutting edges lies within a prescribed range being chosen, this step being performed before determining the number of structure elements.

9. The method according to claim 1, wherein auxiliary wafer structures or potential wafer structures are determined for at least 50 or 40 or 30 different threshold values.

10. The method according to claim 1, wherein a number of stability ranges are determined for a mask structure.

11. The method according to claim 10, comprising the step of:
determining a preferred stability range from a number of stability ranges, the stability range within which the wafer structure has the greatest number or a prescribed number of structure elements or comprises the greatest range of intensities being chosen as the preferred stability range.

12. The method according to claim 10, comprising the step of:
determining a preferred stability range from a number of stability ranges, the stability range which comes closest to, as compared to other stability ranges, or is greater than or less than a prescribed ratio of a number of transparent structure elements and a number of non-transmissive structure elements being chosen as the preferred stability range.

13. The method according to claim 10, wherein a structure type of at least one of the structure elements is determined for at least two stability ranges, the stability range for which the structure type that is determined corresponds to a prescribed structure type being chosen as a preferred stability range.

14. A microscope for determining a wafer structure of a mask, having:
a light source and an illumination optical unit for illuminating the mask,
an imaging optical unit for projecting an image of the mask onto a detector, and
a computing unit for reading out the aerial image from the detector, the computing unit being programmed for carrying out the method according to claim 1.

15. A method for determining a threshold value for the determination of a mask structure, comprising the steps of:
providing an aerial image of the mask structure,
prescribing a range of intensities,
prescribing different threshold values within the range of intensities,
determining an auxiliary wafer structure or potential wafer structure for each of the threshold values,
determining a numerical value representing a number of structure elements for each of the auxiliary wafer structures or potential wafer structures,
determining a stability range consisting of successive threshold values within the range of intensities for which the numerical value representing the number of structure elements of the auxiliary wafer structures or potential wafer structures lies within a prescribed range or remains constant, and
determining the threshold value as a threshold value within the stability range.

16. The method according to claim 15, comprising the step of:
determining a target threshold value that lies within or in the middle of an upper limit and a lower limit of the stability range.

17. The method according to claim 16, wherein the determination of the auxiliary wafer structure or potential wafer structure from the aerial image comprises subdividing the aerial image into first regions and second regions on the basis of the threshold value within the stability range.

18. The method according to claim 17, wherein locations of the aerial image are assigned to the first regions if intensity values of the aerial image are greater than the threshold value within the stability range or the target threshold value, while locations of the aerial image are assigned to the second regions if the intensity values are less than the threshold value within the stability range or the target threshold value.

19. The method according to claim 17, wherein transparent or reflective structure elements are formed as contiguous regions of the first regions and non-transmissive or absorbent structure elements are formed as contiguous regions of the second regions.

20. The method according to claim 15, wherein the aerial image is determined by being recorded by a microscope or is simulated from the mask structure.

21. The method according to claim 15, comprising the step of:
trimming a peripheral region of the aerial image, cutting edges at which the fluctuation of the intensity along the cutting edges lies within a prescribed range being chosen, this step being performed before determining the number of structure elements.

22. The method according to claim 15, wherein auxiliary wafer structures or potential wafer structures are determined for at least 50 or 40 or 30 different threshold values.

23. The method according to claim 15, wherein a number of stability ranges are determined for a mask structure.

24. The method according to claim 23, comprising the step of:
   determining a preferred stability range from a number of stability ranges, the stability range within which the wafer structure has the greatest number or a prescribed number of structure elements or comprises the greatest range of intensities being chosen as the preferred stability range.

25. The method according to claim 23, comprising the step of:
   determining a preferred stability range from a number of stability ranges, the stability range which comes closest to or is greater than or less than a prescribed ratio of a number of transparent structure elements and a number of non-transmissive structure elements being chosen as the preferred stability range.

26. The method according to claim 23, wherein a structure type of at least one of the structure elements is determined for at least two stability ranges, the stability range for which the structure type that is determined corresponds to a prescribed structure type being chosen as a preferred stability range.

* * * * *